(12) United States Patent
Tanaka et al.

(10) Patent No.: US 9,459,419 B2
(45) Date of Patent: Oct. 4, 2016

(54) OPTO-ELECTRIC HYBRID MODULE

(71) Applicant: NITTO DENKO CORPORATION, Ibaraki-shi, Osaka (JP)

(72) Inventors: Naoyuki Tanaka, Ibaraki (JP); Yasuto Ishimaru, Ibaraki (JP); Naoki Shibata, Ibaraki (JP); Yuichi Tsujita, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/910,048

(22) PCT Filed: Jul. 3, 2014

(86) PCT No.: PCT/JP2014/067809
§ 371 (c)(1),
(2) Date: Feb. 4, 2016

(87) PCT Pub. No.: WO2015/025623
PCT Pub. Date: Feb. 26, 2015

(65) Prior Publication Data
US 2016/0178863 A1 Jun. 23, 2016

(30) Foreign Application Priority Data

Aug. 21, 2013 (JP) .................................. 2013-171350

(51) Int. Cl.
*G02B 6/12* (2006.01)
*G02B 6/42* (2006.01)
(Continued)

(52) U.S. Cl.
CPC .............. *G02B 6/4281* (2013.01); *G02B 6/122* (2013.01); *G02B 6/13* (2013.01)

(58) Field of Classification Search
CPC ....... G02B 6/4281; G02B 6/122; G02B 6/13
USPC ................................................. 385/14, 88–93
See application file for complete search history.

(56) References Cited

U.S. PATENT DOCUMENTS

| 7,907,803 B2 * | 3/2011 | Hodono | G02B 6/1221 |
| | | | 156/305 |
| 8,208,268 B2 * | 6/2012 | Kajiki | H05K 1/144 |
| | | | 257/774 |

(Continued)

FOREIGN PATENT DOCUMENTS

| JP | 2007-156026 A | 6/2007 |
| JP | 2010-190994 A | 9/2010 |

(Continued)

OTHER PUBLICATIONS

Notification of Transmittal of Translation of the International Preliminary Report on Patentability dated Mar. 3, 2016, Form PCT/IB/338, Form PCT/IB/373 and Form PCT/ISA/237, issued in International Application No. PCT/JP2014/067809, English translation. (5 pages).

(Continued)

*Primary Examiner* — Ellen Kim
(74) *Attorney, Agent, or Firm* — Westerman, Hattori, Daniels & Adrian, LLP

(57) ABSTRACT

An opto-electric hybrid module is provided which has a linear light-path core and an electric circuit including mounting pads and an electric circuit body provided on a surface of an under-cladding layer of an optical waveguide. An optical element is mounted with its electrodes in abutment against the mounting pads. The electric circuit body and a portion of the surface of the under-cladding layer other than a core formation portion and an electric circuit formation portion are covered with a stack including a core material layer and an over-cladding material layer. A surface portion of the stack present between the mounting pads and the electric circuit body is located at a lower height position than a surface portion of the stack present on the electric circuit body.

2 Claims, 5 Drawing Sheets

(51) Int. Cl.
  *G02B 6/122* (2006.01)
  *G02B 6/13* (2006.01)

(56) References Cited

U.S. PATENT DOCUMENTS

| | | | |
|---|---|---|---|
| 2004/0114854 A1* | 6/2004 | Ouchi | G02B 6/43 |
| | | | 385/14 |
| 2010/0061679 A1 | 3/2010 | Hayashi et al. | |
| 2010/0209054 A1 | 8/2010 | Hodono | |
| 2010/0323297 A1 | 12/2010 | Yanagisawa | |
| 2012/0251036 A1 | 10/2012 | Inoue et al. | |
| 2013/0011096 A1 | 1/2013 | Yanagisawa | |
| 2014/0369642 A1* | 12/2014 | Yanagisawa | G02B 6/12002 |
| | | | 385/14 |
| 2016/0116690 A1* | 4/2016 | Tanaka | G02B 6/4214 |
| | | | 385/14 |

FOREIGN PATENT DOCUMENTS

| | | |
|---|---|---|
| JP | 2011-3774 A | 1/2011 |
| JP | 2012-208306 A | 10/2012 |

OTHER PUBLICATIONS

International Search Report dated Aug. 5, 2014, issued in counterpart International Application No. PCT/JP2014/067809 (2 pages).

* cited by examiner

OPTO-ELECTRIC HYBRID MODULE

TECHNICAL FIELD

The present invention relates to an opto-electric hybrid module which includes an optical waveguide, an electric circuit provided directly on the optical waveguide, and an optical element (a light emitting element or a light receiving element) mounted on the electric circuit.

BACKGROUND ART

Opto-electric hybrid modules are typically produced by: individually producing a flexible circuit board including an electric circuit provided on a surface of an insulation layer, and an optical waveguide including an under-cladding layer, a core and an over-cladding layer stacked in this order; bonding a back surface of the insulation layer of the flexible circuit board to a surface of the over-cladding layer of the optical waveguide with an adhesive agent; and mounting an optical element on a predetermined portion (mounting pads) of the electric circuit. The electric circuit has a rectangular sectional shape. The opto-electric hybrid modules are flexible, and are advantageous for use in a bent state in a small space and for use in a movable portion such as a hinge portion to meet a recent demand for size reduction of electronic devices and the like.

An opto-electric hybrid module as shown in a transverse sectional view of FIG. 4 (see, for example, PTL1) is proposed, in which an electric circuit including mounting pads 4a and an electric circuit body 4 are provided directly on a surface of an over-cladding layer 13 of an optical waveguide W1 (without provision of an insulation layer) for simplification of the production method thereof. In the opto-electric hybrid module, the electric circuit body 4 is generally coated with a cover lay 14 of an insulative resin. In FIG. 4, reference character 5 designates an optical element, and reference character 5a designates electrodes of the optical element 5. Reference character 11 designates an under-cladding layer of the optical waveguide W1, and reference character 12 designates a core of the optical waveguide W1.

An opto-electric hybrid module as shown in a transverse sectional view of FIG. 5 (see, for example, PTL2) is also proposed, in which a distance between an optical element 5 and a core 22 is reduced by forming an electric circuit including an electric circuit body 4 and mounting pads 4a on a surface of an under-cladding layer 21 of an optical waveguide W2 to thereby improve the optical coupling efficiency between the optical element 5 and the core 22. In the opto-electric hybrid module, the electric circuit body 4 is not covered with the cover lay 14 (see FIG. 4) but is covered with a part 23a of an over-cladding layer 23. In FIG. 5, reference character 22a designates positioning guides defined by parts of the core 22 to surround the mounting pads 4a for positioning electrodes 5a of the optical element 5 with respect to the mounting pads 4a.

As described above, the opto-electric hybrid modules are required to be flexible and, therefore, the cover lay 14 and the part 23a of the over-cladding layer 23 each covering the electric circuit body 4 preferably each have a smaller thickness.

RELATED ART DOCUMENT

Patent Documents

PTL1: JP-A-2007-156026
PTL2: JP-A-2010-190994

SUMMARY OF INVENTION

If a material having a lower solvent content (not higher than 15 wt %) is used for formation of the cover lay 14 and the over-cladding layer 23, the electric circuit body 4 can be properly covered with a film of the material having a smaller thickness (see FIGS. 4 and 5). If a material having a higher solvent content (not lower than 25 wt %) is used, on the other hand, the electric circuit body 4 cannot be properly covered with a film of the material having a smaller thickness, i.e., edges of the electric circuit body 4 are uncovered with the film (see FIG. 6B).

The cover lay 14 or the part 23a of the over-cladding layer 23 is typically formed in the following manner by a photolithography process using a photosensitive resin as the material. First, as shown in FIG. 6A), a photosensitive resin layer 31 is formed on a surface of a substrate 30 to cover an electric circuit body 4 formed on the surface of the substrate 30. Then, as shown in FIG. 6B), the photosensitive resin layer 31 is dried. At this time, a solvent contained in the photosensitive resin layer 31 is evaporated and, therefore, the thickness of the photosensitive resin layer 31 is reduced as the solvent content is increased. The thickness reduction percentage is constant throughout the photosensitive resin layer 31. A portion of the photosensitive resin layer 31 present on a surface of the electric circuit body 4 has a smaller original thickness and correspondingly has a smaller thickness reduction amount. A portion of the photosensitive resin layer 31 present between adjacent circuit portions of the electric circuit body 4 has a greater original thickness and correspondingly has a greater thickness reduction amount. Therefore, a surface portion of the dried photosensitive resin layer 31 around the electric circuit body 4 has a greater inclination, so that parts of the electric circuit body 4 (particularly, edges of the electric circuit body 4) are liable to be uncovered. Then, the photosensitive resin layer 31 is cured as it is by exposure to light.

With the electric circuit body 4 partly uncovered, short circuit is liable to occur, so that the opto-electric hybrid module is liable to malfunction. If the thickness of the cover lay 14 (see FIG. 4) or the thickness of the part 23a of the over-cladding layer 23 (see FIG. 5) is increased to cope with this, the flexibility of the opto-electric hybrid module will be impaired.

In view of the foregoing, it is an object of the present invention to provide an opto-electric hybrid module which has sufficient flexibility with its electric circuit body properly covered with a film formed by a photolithography process employing a photosensitive resin having a higher solvent content.

According to the present invention to achieve the above object, there is provided an opto-electric hybrid module, which includes: an optical waveguide; an electric circuit including an electric circuit body and mounting pads provided directly on an under-cladding layer of the optical waveguide; and an optical element mounted on the mounting pads; the optical waveguide including an under-cladding layer, a linear light-path core provided on a core formation portion of a surface of the under-cladding layer as projecting from the surface of the under-cladding layer, and an over-cladding layer covering the core; the optical element being positioned at a predetermined position above a portion of the over-cladding layer present on a top surface of the light-path core; wherein the electric circuit is provided on an electric circuit formation portion of the under-cladding layer; wherein the electric circuit body and a portion of the surface of the under-cladding layer other than the core formation portion and the electric circuit formation portion are covered with a stack including a core material layer made of the same material as the core and an over-cladding material layer made of the same material as the over-cladding layer; wherein a surface portion of the stack present between the mounting pads and the electric circuit body, the surface portion shown as B of FIG. 1B, is located at a lower height position than a surface portion of the stack present on the electric circuit body, the surface portion shown as A of FIG. 1B, as measured from the surface of the under-cladding layer.

In the inventive opto-electric hybrid module, the electric circuit is provided on the surface of the under-cladding layer. Thus, the core and the over-cladding layer can be formed after the formation of the electric circuit. Therefore, when the core is formed, the electric circuit body can be covered with the core material layer made of the same material as the core and, when the over-cladding layer is thereafter formed, the electric circuit body can be further covered with the over-cladding material layer made of the same material as the over-cladding layer.

Even if the electric circuit body is not properly covered with the core material layer but parts (e.g., edges) of the electric circuit body are uncovered in a core formation step, the uncovered parts of the electric circuit body can be properly covered with the over-cladding material layer in the subsequent over-cladding layer formation step.

In the inventive opto-electric hybrid module, the electric circuit is provided on the surface of the under-cladding layer of the optical waveguide, whereby the electric circuit body and the portion of the surface of the under-cladding layer other than the core formation portion and the electric circuit formation portion can be covered with the stack including the core material layer and the over-cladding material layer. Even if the core material layer has a smaller thickness, i.e., even if the electric circuit body is not properly covered with the core material layer but the parts (e.g., edges) of the electric circuit body are uncovered, therefore, the uncovered parts of the electric circuit body can be properly covered with the over-cladding material layer in the subsequent over-cladding layer formation step. Thus, even if the thickness of the stack is reduced, the electric circuit body is prevented from being partly uncovered. Further, the surface portion of the stack present between the mounting pads and the electric circuit body, the surface portion shown as B of FIG. 1B, is located at a lower height position than the surface portion of the stack present on the electric circuit body, the surface portion shown as A of FIG. 1B, as measured from the surface of the under-cladding layer. With the synergistic effect of these arrangements, the inventive opto-electric hybrid module is excellent in flexibility.

Particularly, peripheral portions of the mounting pads are covered with the stack, thereby inner peripheral walls of the stack are formed on the mounting pads, which serve as positioning guides for positioning electrodes of the optical element. Thus, the electrodes of the optical element can be respectively positioned on center portions of the mounting pads and surrounded by the inner peripheral walls of the stack. In this case, the positioning accuracy for the mounting of the optical element can be increased, thereby improving the light transmission efficiency between the optical element and the core.

DESCRIPTION OF EMBODIMENT

An embodiment of the present invention will hereinafter be described in detail based on the attached drawings.

Figure 1A:
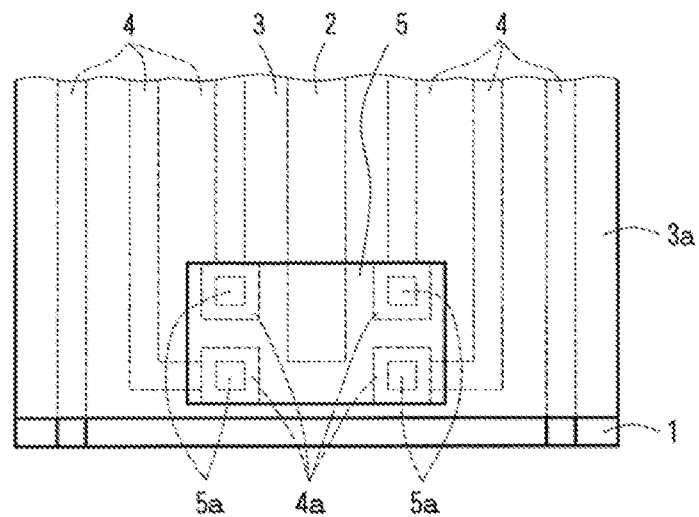
FIGS. 1A and 1B are a plan view and a transverse sectional view, respectively, schematically illustrating an opto-electric hybrid module according to one embodiment of the present invention.
Figure 1B:
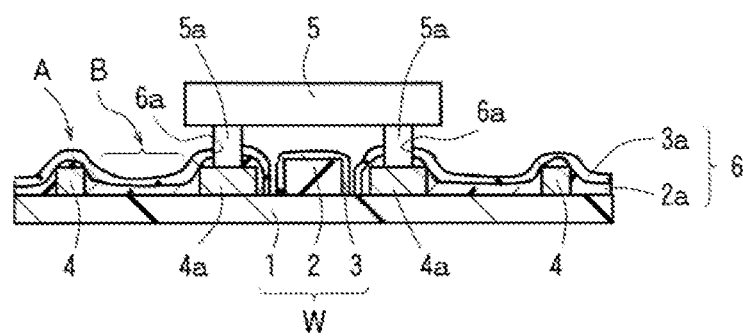

FIGS. 1A and 1B are a plan view and a transverse sectional view, respectively, schematically illustrating an end portion (major portion) of an opto-electric hybrid module according to one embodiment of the present invention. In the opto-electric hybrid module according to this embodiment, a linear light-path core 2 is provided on a core formation portion of a surface of an under-cladding layer 1 of an optical waveguide W, and an electric circuit including an electric circuit body 4 and mounting pads 4a is provided on an electric circuit formation portion of the surface of the under-cladding layer 1, other than the core formation portion. An optical element 5 is mounted on the mounting pads 4a with its electrodes 5a in abutment against the mounting pads 4a. The core 2 is covered with an over-cladding layer 3, and a center portion of the optical element 5 is positioned above a portion of the over-cladding layer 3 present on a top surface of the core 2. The electric circuit body 4 and a portion of the surface of the under-cladding layer 1 other than the core formation portion and the electric circuit formation portion are covered with a stack 6 including a core material layer 2a made of the same material as the core 2 and an over-cladding material layer 3a made of the same material as the over-cladding layer 3. These materials are each a photosensitive resin having a solvent content of not less than 25 wt %. These photosensitive resins are formed into the core material layer 2a and the over-cladding layer 3a respectively by a photolithography method. A surface portion B of the stack 6 present between the mounting pads 4a and the electric circuit body 4 is located at a lower height position than a surface portion A of the stack 6 present on the electric circuit body 4 as measured from the surface of the under-cladding layer 1.

As described above, the electric circuit body 4 is covered with the stack 6. Therefore, even if the electric circuit body 4 is not properly covered with the core material layer 2a but parts (e.g., edges) of the electric circuit body 4 are uncovered, the uncovered parts of the electric circuit body 4 can be properly covered with the over-cladding material layer 3a. Even if the stack 6 has a small thickness, the electric circuit body 4 is prevented from being partly uncovered. Further, as described above, the surface portion B of the stack 6 present between the mounting pads 4a and the electric circuit body 4 is located at a lower height position than the surface portion A of the stack 6 present on the electric circuit body 4 as measured from the surface of the under-cladding layer 1. The synergistic effect of these arrangements makes it possible to impart the opto-electric hybrid module with excellent flexibility.

In this embodiment, peripheral portions of the mounting pads 4a are covered with the two-layer stack 6 including the core material layer 2a and the over-cladding material layer 3a, and center portions of the mounting pads 4a are uncovered. Thus, inner peripheral walls 6a of the stack 6 present on the peripheral portions of the mounting pads 4a serve as positioning guides for positioning the electrodes 5a of the optical element 5 on the center portions of the mounting pads 4a when the optical element 5 is mounted on the mounting pads 4a. This increases the positioning accuracy of the optical element 5 in the opto-electric hybrid module, thereby improving the light transmission efficiency between the optical element 5 and the core 2.

The opto-electric hybrid module may be produced, for example, in the following manner.

First, a flat base 10 (see FIG. 2A) to be used for formation of an under-cladding layer 1 thereon is prepared. Exemplary materials for the base 10 include metals such as stainless steel, glass, quartz, silicon and resins.

Figure 2A:
FIG. 2A is a schematic diagram for explaining a method of forming an under-cladding layer of an optical waveguide of the opto-electric hybrid module.

Then, as shown in a transverse sectional view of FIG. 2A, the under-cladding layer 1 is formed in a flat shape on a surface of the base 10. Exemplary materials for the under-cladding layer 1 include photosensitive resins and thermosetting resins. The formation of the under-cladding layer 1 may be achieved by a formation method suitable for the material to be used. The under-cladding layer 1 has a thickness of, for example, 1 to 100 μm.

Figure 2B:
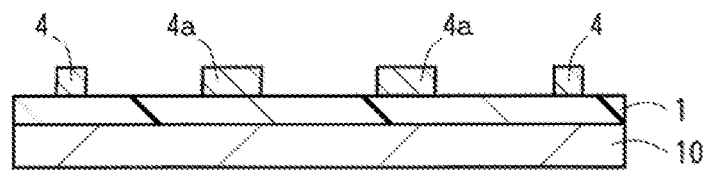
FIG. 2B is a schematic diagram for explaining a method of forming an electric circuit of the opto-electric hybrid module.

Next, as shown in a transverse sectional view of FIG. 2B, an electric circuit including an electric circuit body 4 and mounting pads 4a is formed on a surface of the under-cladding layer 1, for example, by a semi-additive method.

Figure 2C:
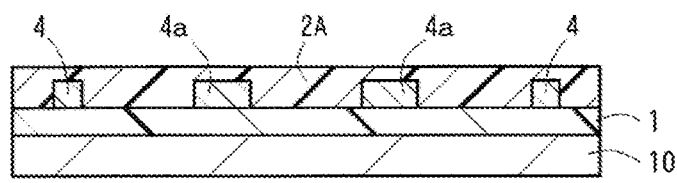
FIGS. 2C to 2E are schematic diagrams for explaining a method of forming a core of the optical waveguide.

Then, as shown in a transverse sectional view of FIG. 2C, a photosensitive resin having a solvent content of not less than 25 wt % for core formation is applied on the surface of the under-cladding layer 1 as covering the electric circuit, whereby a photosensitive resin layer 2A is formed.

Figure 2D:
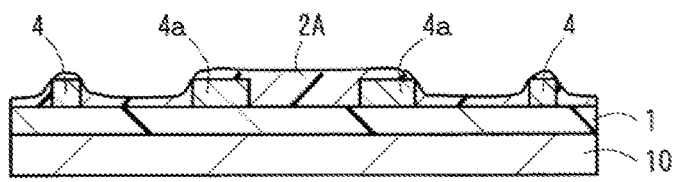

In turn, as shown in a transverse sectional view of FIG. 2D, the photosensitive resin layer 2A is dried. At this time, a solvent contained in the photosensitive resin layer 2A is evaporated, so that the thickness of the photosensitive resin layer 2A is reduced at a constant percentage. Therefore, surface portions of the dried photosensitive resin layer 2A around the electric circuit body 4 have a greater inclination, so that parts of the electric circuit body 4 (particularly, edges of the electric circuit body 4) are liable to be uncovered. Since the mounting pads 4a are spaced a small distance (not greater than 200 μm) from each other, surface portions of the dried photosensitive resin layer 2A around the mounting pads 4a have a smaller inclination due to the surface tension and the like of the photosensitive resin without significant reduction in the thicknesses thereof.

Figure 2E:
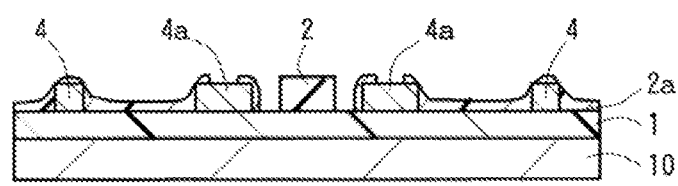

Thereafter, as shown in a transverse sectional view of FIG. 2E, a portion of the photosensitive resin layer 2A between the mounting pads 4a is formed into a core 2, and a portion of the photosensitive resin layer 2A covering peripheral portions of the mounting pads 4a, the electric circuit body 4a and a portion of the surface of the under-cladding layer 1 other than a core formation portions and an electric circuit formation portion are formed into a core material layer 2a by a photolithography process. The core 2 has a height of 5 to 100 μm and a width of 5 to 100 μm, for example.

Figure 3A:
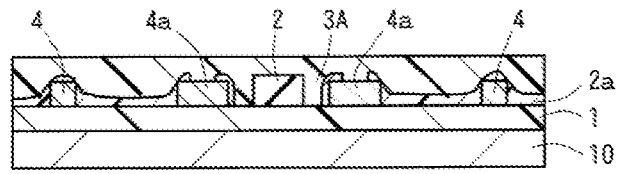
FIGS. 3A to 3C are schematic diagrams for explaining a method of forming an over-cladding layer of the optical waveguide.

Subsequently, as shown in a transverse sectional view of FIG. 3A, a photosensitive resin for over-cladding layer formation is applied over the surface of the under-cladding layer 1 to form a photosensitive resin layer 3A which covers the core 2 and the core material layer 2a. In this embodiment, the photosensitive resin for the over-cladding layer formation has a solvent content of not less than 25 wt %.

Figure 3B:
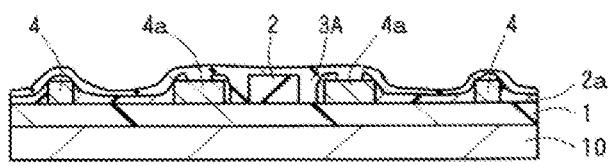

Then, as shown in a transverse sectional view of FIG. 3B, the photosensitive resin layer 3A is dried. At this time, a solvent contained in the photosensitive resin layer 3A is evaporated, so that the thickness of the photosensitive resin layer 3A is reduced at a constant percentage as in the case of the photosensitive resin layer 2A for the core formation (see FIG. 2D). However, the surface of the photosensitive resin layer 3A has a moderate inclination, because the inclined core material layer 2a underlies the photosensitive resin layer 3A. Therefore, the uncovered parts of the electric circuit body 4 can be properly covered with the photosensitive resin layer 3A.

Figure 3C:
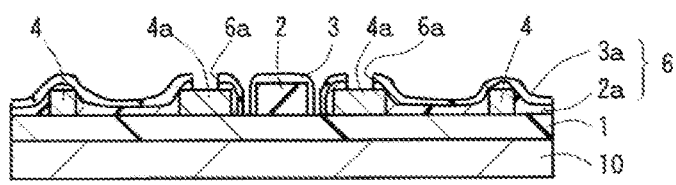

Thereafter, as shown in a transverse sectional view of FIG. 3C, a portion of the photosensitive resin layer 3A covering the core 2 is formed into an over-cladding layer 3, and a portion of the photosensitive resin layer 3A covering the core material layer 2a is formed into an over-cladding material layer 3a by a photolithography process. A stack 6 thus formed as including the core material layer 2a and the over-cladding material layer 3a has inner peripheral walls 6a present on peripheral portions of the mounting pads 4a of the electric circuit. The over-cladding layer 3 has a thickness (film thickness) of, for example, 1 to 50 μm.

Figure 3D:
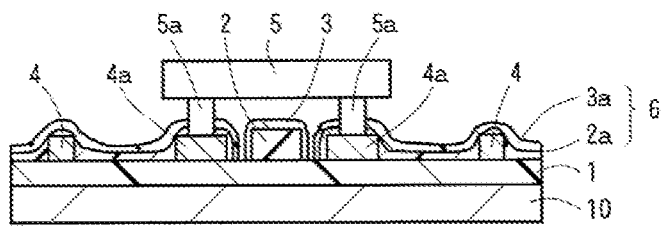
FIG. 3D is a schematic diagram for explaining a method of mounting an optical element of the opto-electric hybrid module.

Then, as shown in a transverse sectional view of FIG. 3D, an optical element 5 is mounted on the mounting pads 4a with lower end faces of electrodes 5a thereof in abutment against top surfaces of the mounting pads 4a of the electric circuit. At this time, the inner peripheral walls 6a of the stack 6 (see FIG. 3C) serve as positioning guides for positioning the electrodes 5a of the optical element 5. Therefore, the electrodes 5a of the optical element 5 can be properly positioned on center portions of the mounting pads 4a. Thus, the optical element 5 can be positioned with higher positioning accuracy. With the optical element 5 thus mounted, a center portion of the optical element 5 is positioned above a portion of the over-cladding layer 3 present on a top surface of the core 2.

Figure 3E:
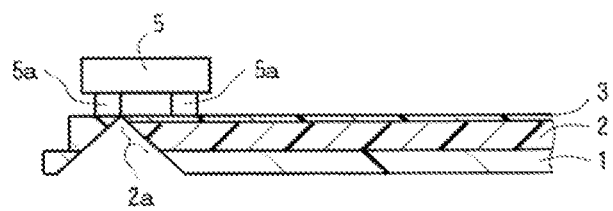
FIG. 3E is a schematic diagram for explaining a method of forming a light reflecting surface on the core.

Subsequently as shown in a longitudinal sectional view of FIG. 3E, the base 10 (see FIG. 3D) is removed from a back surface of the under-cladding layer 1, and then a predetermined portion of the core 2 is cut off from aback side of the under-cladding layer 1 by means of a cutting blade or by laser processing. Thus, a light reflecting surface 2a inclined at 45 degrees with respect to an axis of the core 2 is formed. The light reflecting surface 2a reflects light to deflect a light path for light transmission between the core 2 and the optical element 5. Thus, the opto-electric hybrid module is produced.

In this embodiment, a space defined between the over-cladding layer 3 and the optical element 5 may be sealed with a sealing resin.

Next, an example of the present invention will be described in conjunction with a conventional example. However, it should be understood that the present invention be not limited to the inventive example.

EXAMPLE

An opto-electric hybrid module was produced in the same manner as in the aforementioned embodiment (see FIGS. 1A and 1B). An under-cladding layer had a thickness of 10 µm, and a core had a thickness of 12 µm and a width of 15 µm. An over-cladding layer had a thickness of 2 µm, and a copper electric circuit had a thickness of 10 µm. A portion of a core material layer and a portion of an over-cladding material layer covering the copper electric circuit each had a thickness of 2 µm. A portion of the core material layer and a portion of the over-cladding material layer present between an electric circuit body and mounting pads of the copper electric circuit each had a thickness of 4 µm.

Under-Cladding Layer

A material for the under-cladding layer was prepared by mixing 42 parts by weight of 2,2-bis(trifluoromethyl)-4,4-diaminobiphenyl (TFMB), 58 parts by weight of 2,2-bis(3,4-dicarboxyphenyl)hexafluoropropane anhydride (6FDA) and 30 parts by weight of MM-500 and 2 parts by weight of NKS-4.

Core and Core Material Layer

A material for the core and the core material layer was prepared by mixing 50 parts by weight of o-cresol novolak glycidyl ether (YDCN-700-10 available from Nippon Steel & Sumikin Chemical Co., Ltd.), 50 parts by weight of bisphenoxyethanol fluorene glycidyl ether (OGSOL EG available from Osaka Gas Chemicals Co., Ltd.), 1 part by weight of a photo-acid generator (SP170 available from Adeka Corporation) and 50 parts by weight of ethyl lactate (available from Musashino Chemical Laboratory, Ltd.)

Over-Cladding Layer and Over-Cladding Material Layer

A material for the over-cladding layer and the over-cladding material layer was prepared by mixing 50 parts by weight of a modified aliphatic epoxy resin (EPICLONEXA-4816 available form DIC Corporation), 30 parts by weight of a bifunctional alicyclic epoxy resin (CEROXIDE 2021P available from Daicel Chemical Industries, Ltd.), 20 parts by weight of a polycarbonate diol (PRACCEL CD205PL available from Daicel Chemical Industries, Ltd.), 2 parts by weight of a photo-acid generator (SP170 available from Adeka Corporation) and 40 parts by weight of ethyl lactate (available from Musashino Chemical Laboratory, Ltd.)

Conventional Example 1

Figure 4:
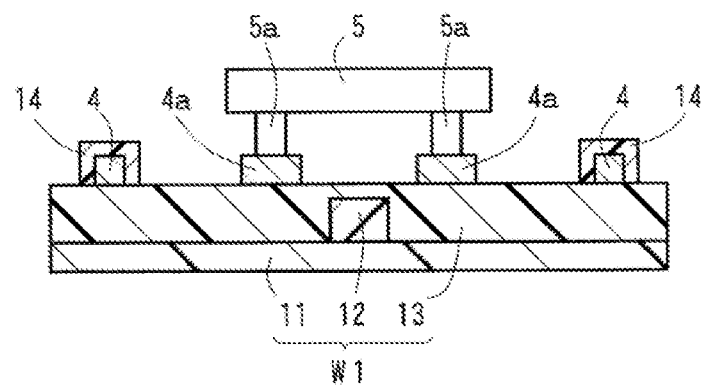
FIG. 4 is a transverse sectional view schematically illustrating a prior-art opto-electric hybrid module.

An opto-electric hybrid module shown in FIG. 4 was produced in substantially the same manner as in the Example, except that a cover lay was formed from a photosensitive polyimide resin as having a film thickness of 4 µm.

Conventional Example 2

Figure 5:
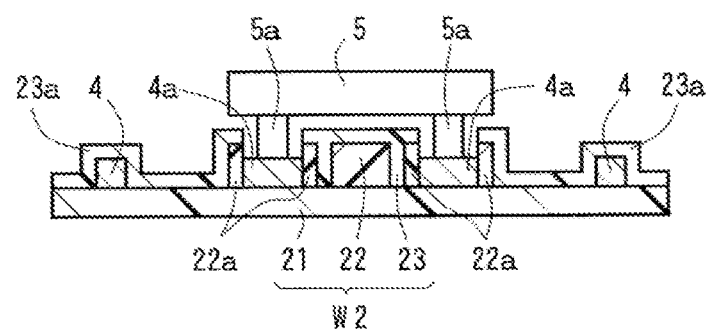
FIG. 5 is a transverse sectional view schematically illustrating another prior-art opto-electric hybrid module.
Figure 6A:
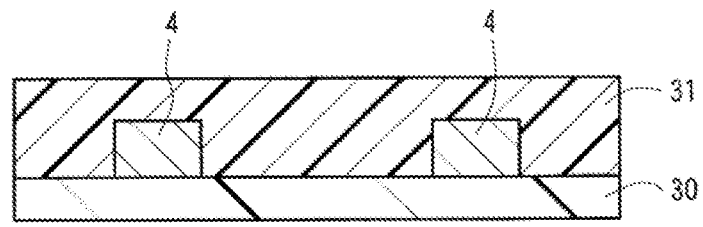
FIGS. 6A and 6B are schematic diagrams for explaining a prior-art method of covering an electric circuit.
Figure 6B:
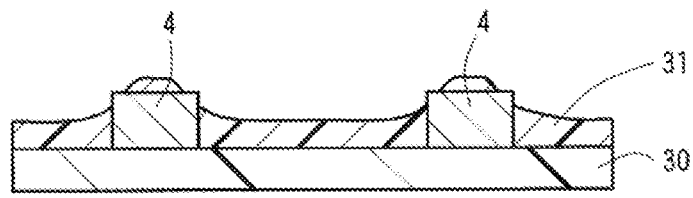

An opto-electric hybrid module shown in FIG. 5 was produced in substantially the same manner as in the Example, except that the over-cladding layer covering the electric circuit body had a film thickness of 4 µm.

Evaluation for Film Thickness of Electric Circuit Body Covering Portion in Section The opto-electric hybrid modules of the Example and Conventional Examples 1 and 2 were each cut perpendicularly to the electric circuit body, and the electric circuit body was checked for partially uncovered portions thereof. As a result, it was found that the opto-electric hybrid module of the Example was free from uncovered portions of the electric circuit body but the opto-electric hybrid modules of Comparative Examples 1 and 2 suffered from the uncovered portions of the edges of the electric circuit body. These results indicate that the Example is more excellent in reliability than Conventional Examples 1 and 2.

A material for the over-cladding layer and the over-cladding material layer was prepared in substantially the same manner as in the Example, except that ethyl lactate was used in a proportion of 15 parts by weight. Then, an opto-electric hybrid module was produced in the same manner as in the Example by using the material thus prepared. As a result, the opto-electric hybrid module thus produced was also free from uncovered portions of the electric circuit body.

A material for the core and the core material layer and a material for the over-cladding layer and the over-cladding material layer were each prepared in substantially the same manner as in the Example, except that ethyl lactate was used in a proportion of 25 parts by weight. Then, an opto-electric hybrid module was produced in the same manner as in the Example by using the materials thus prepared. As a result, the opto-electric hybrid module thus produced was also free from uncovered portions of the electric circuit body as in the Example.

While a specific form of the embodiment of the present invention has been shown in the aforementioned inventive example, the inventive example is merely illustrative of the invention but not limitative of the invention. It is contemplated that various modifications apparent to those skilled in the art could be made within the scope of the invention.

The inventive opto-electric hybrid module has sufficient flexibility with its electric circuit body properly covered with a film formed by the photolithography process employing a photosensitive resin having a higher solvent content.

REFERENCE SIGNS LIST

W: OPTICAL WAVEGUIDE
A: PORTION OF STACK PRESENT ON ELECTRIC CIRCUIT BODY
B: PORTION OF STACK PRESENT BETWEEN ELECTRIC CIRCUIT BODY AND MOUNTING PADS
1: UNDER-CLADDING LAYER
2: CORE
3: OVER-CLADDING LAYER
4: ELECTRIC CIRCUIT BODY
4a: MOUNTING PAD
5: OPTICAL ELEMENT
5a: ELECTRODE
6: STACK

What is claimed is:

1. An opto-electric hybrid module comprising:
an optical waveguide;
an electric circuit including an electric circuit body and mounting pads provided directly on an under-cladding layer of the optical waveguide; and
an optical element mounted on the mounting pads;
the optical waveguide including the under-cladding layer, a linear light-path core provided on a core formation portion of a surface of the under-cladding layer and projecting from the surface of the under-cladding layer, and an over-cladding layer covering the linear light-path core;
the optical element being positioned at a predetermined position above a portion of the over-cladding layer present on a top surface of the light-path core;
wherein the electric circuit is provided on an electric circuit formation portion of the under-cladding layer;
wherein the electric circuit body and a portion of the surface of the under-cladding layer other than the core formation portion and the electric circuit formation portion are covered with a stack including a core material layer made of the same material as the core and an over-cladding material layer made of the same material as the over-cladding layer;
wherein a surface portion of the stack present between the mounting pads and the electric circuit body is located at a lower height position than a surface portion of the stack present on the electric circuit body, as measured from the surface of the under-cladding layer.

2. The opto-electric hybrid module according to claim 1, further comprising:
a stack covering peripheral portions of the mounting pads; and
wherein inner peripheral walls of the stack are formed on the peripheral portions of the mounting pads, and
wherein the electrodes of the optical element are respectively positioned on center portions of the mounting pads and are surrounded by the inner peripheral walls of the stack.

* * * * *